US009177812B2

(12) United States Patent
Martens et al.

(10) Patent No.: US 9,177,812 B2
(45) Date of Patent: Nov. 3, 2015

(54) METHOD OF MANUFACTURING LOW RESISTIVITY CONTACTS ON N-TYPE GERMANIUM

(75) Inventors: Koen Martens, Leuven (BE); Roger Loo, Leuven (BE); Jorge Kittl, Hamme-Mille (BE)

(73) Assignees: IMEC, Leuven (BE); Katholieke Universiteit Leuven, K.U. LEUVEN R&D, Leuven (BE)

( * ) Notice: Subject to any disclaimer, the term of this patent is extended or adjusted under 35 U.S.C. 154(b) by 17 days.

(21) Appl. No.: 13/310,945

(22) Filed: Dec. 5, 2011

(65) Prior Publication Data

US 2012/0138928 A1 Jun. 7, 2012

Related U.S. Application Data

(60) Provisional application No. 61/420,081, filed on Dec. 6, 2010.

(51) Int. Cl.
*H01L 29/04* (2006.01)
*H01L 21/285* (2006.01)

(52) U.S. Cl.
CPC .............................. *H01L 21/28525* (2013.01)

(58) Field of Classification Search
CPC .................. H01L 21/28512; H01L 21/28518; H01L 21/28525; H01L 21/28568
USPC ............. 257/196, E21.09, E21.092, E29.082, 257/E29.085; 438/488
See application file for complete search history.

(56) References Cited

U.S. PATENT DOCUMENTS 4,999,685 A    3/1991   Waldrop et al.
5,063,174 A    11/1991  Beyea et al.
(Continued)

FOREIGN PATENT DOCUMENTS

EP    1447839 A1    8/2004

OTHER PUBLICATIONS

Lee, Donkoun et al., "The Influence of Fermi Level Pinning/DePinning on the Schottky Barrier Height and Contact Resistance in Ge/CoFeB and Ge/MgO/CoFeB Structures", Applied Physics Letters, vol. 96, 2010, pp. 052514-1-052514-3.
Kobayashi, Masaharu et al., "Fermi-Level Depinning in Metal/Ge Schottky Junction and Its Application to Metal Source/Drain Ge NMOSFET", Proceedings of the Symposium on VLSI Technology Digest of Technical Papers., 2008, pp. 54-55.
(Continued)

*Primary Examiner* — Ermias Woldegeorgis
(74) *Attorney, Agent, or Firm* — McDonnell Boehnen Hulbert & Berghoff LLP

(57) ABSTRACT

Disclosed are methods for manufacturing semiconductor devices and the devices thus obtained. In one embodiment, the method comprises obtaining a semiconductor substrate comprising a germanium region doped with n-type dopants at a first doping level and forming an interfacial silicon layer overlying the germanium region, where the interfacial silicon layer is doped with n-type dopants at a second doping level and has a thickness higher than a critical thickness of silicon on germanium, such that the interfacial layer is at least partially relaxed. The method further includes forming over the interfacial silicon layer a layer of material having an electrical resistivity smaller than $1 \times 10^{-2}$ $\Omega$cm, thereby forming an electrical contact between the germanium region and the layer of material, wherein the electrical contact has a specific contact resistivity below $10^{-4}$ $\Omega$cm$^2$.

15 Claims, 4 Drawing Sheets

(56) References Cited

U.S. PATENT DOCUMENTS

| | | | |
|---|---|---|---|
| 5,168,330 | A | 12/1992 | Vitkavage et al. |
| 5,563,448 | A | 10/1996 | Lee et al. |
| 5,801,444 | A * | 9/1998 | Aboelfotoh et al. .......... 257/762 |
| 5,909,059 | A * | 6/1999 | Hada et al. .................... 257/750 |
| 6,770,954 | B2 * | 8/2004 | Lee et al. ...................... 257/616 |
| 2002/0040983 | A1 * | 4/2002 | Fitzergald .................... 257/183 |
| 2005/0000566 | A1 | 1/2005 | Posthuma et al. |
| 2005/0079692 | A1 * | 4/2005 | Samoilov et al. ............. 438/481 |
| 2006/0073664 | A1 | 4/2006 | Kondo et al. |
| 2006/0086950 | A1 | 4/2006 | Caymax et al. |
| 2007/0262296 | A1 * | 11/2007 | Bauer ............................ 257/19 |
| 2011/0089520 | A1 * | 4/2011 | Lieten et al. .................. 257/472 |

OTHER PUBLICATIONS

Kobayashi, Masaharu et al., "Fermi Level Depinning in Metal/Ge Schottky Junction for Metal Source/Drain Ge Metal-Oxide-Semiconductor Field-Effect-Transistor Application", Journal of Applied Physics, No. 105, 2009, pp. 023702-1-023702-6.

Nelson, S.F. et al., "Ohmic Contacts to n-Type Silicon-Germanium", Appl. Phys. Lett., vol. 69, No. 23, Dec. 2, 1996, pp. 3563-3565.

European Search Report, European Patent Application 11191678.9 dated Apr. 12, 2012.

* cited by examiner

METHOD OF MANUFACTURING LOW RESISTIVITY CONTACTS ON N-TYPE GERMANIUM

CROSS-REFERENCE TO RELATED APPLICATIONS

This application is a nonprovisional of U.S. Provisional Patent Application Ser. No. 61/420,081 filed Dec. 6, 2010, the contents of which are hereby incorporated by reference.

FIELD OF THE INVENTION

The present invention generally relates to electrical contacting of n-type germanium with a conductive material with electrical resistivity smaller than $1\times10^{-2}$ $\Omega$cm, such as for example a metal or a metal silicide. In one aspect, the present invention relates to a method for manufacturing contacts on n type germanium, having a contact resistivity below $10^{-4}$ $\Omega$cm$^2$, for example below $10^{-5}$ $\Omega$cm$^2$. In another aspect the present invention relates to devices thus obtained.

BACKGROUND

Non-ohmic or high resistivity contacts, having a contact resistivity higher than $10^{-4}$ $\Omega$cm$^2$ are a roadblock to applications of germanium (Ge) despite its high potential for e.g. Complementary Metal Oxide Semiconductor (CMOS) transistors or memory elements. Both CMOS applications on Ge and Ge selector diodes for memory elements need low contact resistivity.

Low resistive ohmic n-type contacts on Ge are difficult to form because of strong Fermi-level pinning on germanium (barrier height is about 0.49 to 0.64 eV for a wide range of metal work function). Ge shows a depinning factor of about 0.05 and a charge neutrality level of 0.09 eV, which means Fermi level pinning close to the top of the valence band.

Secondly, n-Ge contacts are difficult to form because of low activation limits and concentration enhanced diffusion of n-type dopants in Ge. Barrier height lowering by means of thin oxides/nitrides was reported, but the contact resistivity obtained was about $1\times10^{-2}$ $\Omega$cm$^2$.

Therefore it is desirable to further lower the contact resistivity of the contacts formed on n-type Ge.

SUMMARY

It is an object of embodiments of the present invention to provide a method for manufacturing an electrical contact between n-type germanium and a layer of material with electrical resistivity smaller than $1\times10^{-2}$ $\Omega$cm, the electrical contact having a low specific contact resistivity, for example a contact resistivity below $10^{-4}$ $\Omega$cm2, such as for example below $10^{-5}$ $\Omega$cm2. It is an object of embodiments of the present invention to provide a semiconductor device with a low specific contact resistivity between n-type germanium and a layer of material with electrical resistivity smaller than $1\times10^{-2}$ $\Omega$cm, for example a contact resistivity of below $10^{-4}$ $\Omega$cm$^2$, such as for example below $10^{-5}$ $\Omega$cm$^2$.

The above objective is accomplished by a method and device according to the present invention.

In a first aspect, the present invention provides a method for manufacturing an electrical contact between n-type germanium and a layer of material with electrical resistivity smaller than $1\times10^{-2}$ $\Omega$cm, such as for example a metal layer or a metal silicide layer. The method includes obtaining a semiconductor substrate having atop a germanium region doped with n-type dopants at a first doping level; forming an interfacial silicon layer overlying the n-type doped germanium region, the interfacial silicon layer being doped with n-type dopants at a second doping level and having a thickness higher than the critical thickness of silicon on germanium, such that the interfacial layer is at least partially relaxed; and forming a layer of material with electrical resistivity smaller than $1\times10^{-2}$ $\Omega$cm overlying the interfacial silicon layer. It is an advantage of a method according to embodiments of the present invention that it allows to manufacture an electrical contact between n-type germanium and a layer of material with electrical resistivity smaller than $1\times10^{-2}$ $\Omega$cm, the contact having a low specific contact resistance, for example a contact resistance below $1\times10^{-4}$ $\Omega$cm$^2$, such as a contact resistance below $1\times10^{-5}$ $\Omega$cm$^2$.

Throughout the description of embodiments of the present invention, the interfacial Si layer will be also referred as the Si-passivation layer.

The interfacial Si layer may be completely covering the n-type doped Ge. The interfacial Si layer can be formed by any deposition technique for example selected from Chemical Vapour Deposition (CVD), Low Pressure Chemical Vapour Deposition CVD (LPCVD), Physical Vapour Deposition (PVD), Molecular Beam Epitaxy (MBE) or any other deposition/growth technique suitable to form a polycrystalline or a monocrystalline silicon layer.

In a method according to embodiments of the present invention, forming an interfacial silicon layer may include forming a silicon layer with a thickness between a few monolayers, such as for example five or ten monolayers, and 50 nm. In these embodiments, the interfacial silicon layer has a thickness lower than 50 nm, such as for example lower than 20 nm.

In embodiments of the present invention, the interfacial Si layer has a thickness higher than the critical thickness of silicon on germanium. The critical thickness depends on the lattice-mismatch between the material to be grown/deposited and the material of the substrate (underlying the material to be grown). Typically, layers with a thickness smaller than the critical thickness are strained, since a certain amount of elastic strain can be accommodated by any material without generating dislocations or defects. Having, in accordance with embodiments of the present invention, a thickness higher than the critical thickness, the interfacial Si layer is not fully strained, but at least partially relaxed due to the defects present in the layer. In some embodiments, the at least partial relaxation is related to a lower electron barrier at the interface between n-type doped Ge and the Si interfacial layer.

The interfacial Si layer is doped with a n-type dopant such as for example P, As or Sb or any combination thereof. In particular embodiments of the present invention, the doping level of the interfacial Si layer may be higher than the doping level of the underlying n-type doped Ge. In particular embodiments, the second doping level of the interfacial silicon layer may be at least $1\times10^{19}$ cm$^{-3}$.

In a method according to embodiments of the present invention, forming the interfacial silicon layer doped with n-type dopants at the second doping level may include introducing n-type dopants into the interfacial silicon layer during formation thereof, e.g. during growth or deposition thereof, by an in-situ doping technique with suitable precursors.

In embodiments of the present invention, forming an interfacial silicon layer may include forming a monocrystalline silicon layer. In alternative embodiments, forming an interfacial silicon layer may include forming a polycrystalline silicon layer. A monocrystalline silicon layer may be used over a polycrystalline silicon layer, as the latter has some roughness and needs to be thicker to form a closed layer. However, polycrystalline silicon might be deposited in a non-epi tool, which may include some manufacturing benefits. In the case of a monocrystalline layer with a thickness higher than the critical thickness, the layer is at least partially relaxed including defects which have a beneficial effect for the method of the present invention.

The n-doped underlying germanium layer/region may either be monocrystalline or polycrystalline and can be formed on a semiconductor substrate such as a silicon wafer. In different embodiments of the present invention the n-type doped germanium layer/region is part of a device.

The growth of the n-doped germanium region can be either selective or non-selective. In one example embodiment, the interfacial Si layer is formed by selective epitaxial growth only on the n-doped germanium region to be contacted.

The n-type germanium is doped with n-type species such as phosphorous, arsenic or antimony or any combinations thereof.

In embodiments of the present invention, the layer overlying the silicon interfacial layer is made of a highly conductive material (i.e. a material with electrical resistivity smaller than $1 \times 10^{-2}$ $\Omega$cm) such as a metal, a metal silicide. The layer of material with electrical resistivity smaller than $1 \times 10^{-2}$ $\Omega$cm can comprise a plurality of layers of made of such a highly conductive material. In particular embodiments the layer of material with electrical resistivity smaller than $1 \times 10^{-2}$ $\Omega$cm is a stack of Ti/TiN.

In particular embodiments the interfacial Si layer can be partly consumed to form a silicide as contact metal.

In a second aspect, the present invention provides a semiconductor device comprising a germanium region doped with n-type dopants at a first doping level; on the germanium region, an interfacial silicon layer doped with n-type dopants at a second doping level, and having a thickness higher than the critical thickness, such that the interfacial layer is at least partially relaxed; and a layer of material with electrical resistivity smaller than $1 \times 10^{-2}$ $\Omega$cm overlying the interfacial silicon layer.

The interfacial silicon layer may have a thickness between a few monolayers (e.g. five or ten monolayers) and 50 nm.

The interfacial silicon layer may have a second doping level higher than the first doping level of the germanium region. In particular embodiments of the second aspect of the present invention, the second doping level of the interfacial silicon layer may be at least $1 \times 10^{19}$ cm$^{-3}$.

The interfacial silicon layer may be a monocrystalline layer or a polycrystalline layer.

The n-doped underlying germanium region may either be monocrystalline or polycrystalline. The germanium region may be (part of) a germanium substrate, or it and can be formed on a semiconductor substrate such as a silicon wafer. In different embodiments of the present invention, the n-type doped germanium region is part of a semiconductor device.

Particular aspects of the present invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 4(c) illustrates I-V$_s$ of CTLM (circular transmission line method) structures (for the particular embodiment where $r_1=30$ μm, $r_2-r_1=5$ μm) with reference in-situ doped Ge/Ti stack of the prior art and with 10 nm and, respectively, 16 nm in-situ doped silicon in accordance with embodiments of the present invention. FIG. 4(d) shows a model fit to CTLM resistances at −0.5V of in-situ doped Ge/10 nm doped Si/Ti samples of various radius ($r_1$) and slit width ($r_2-r_1$).

Figure 1:
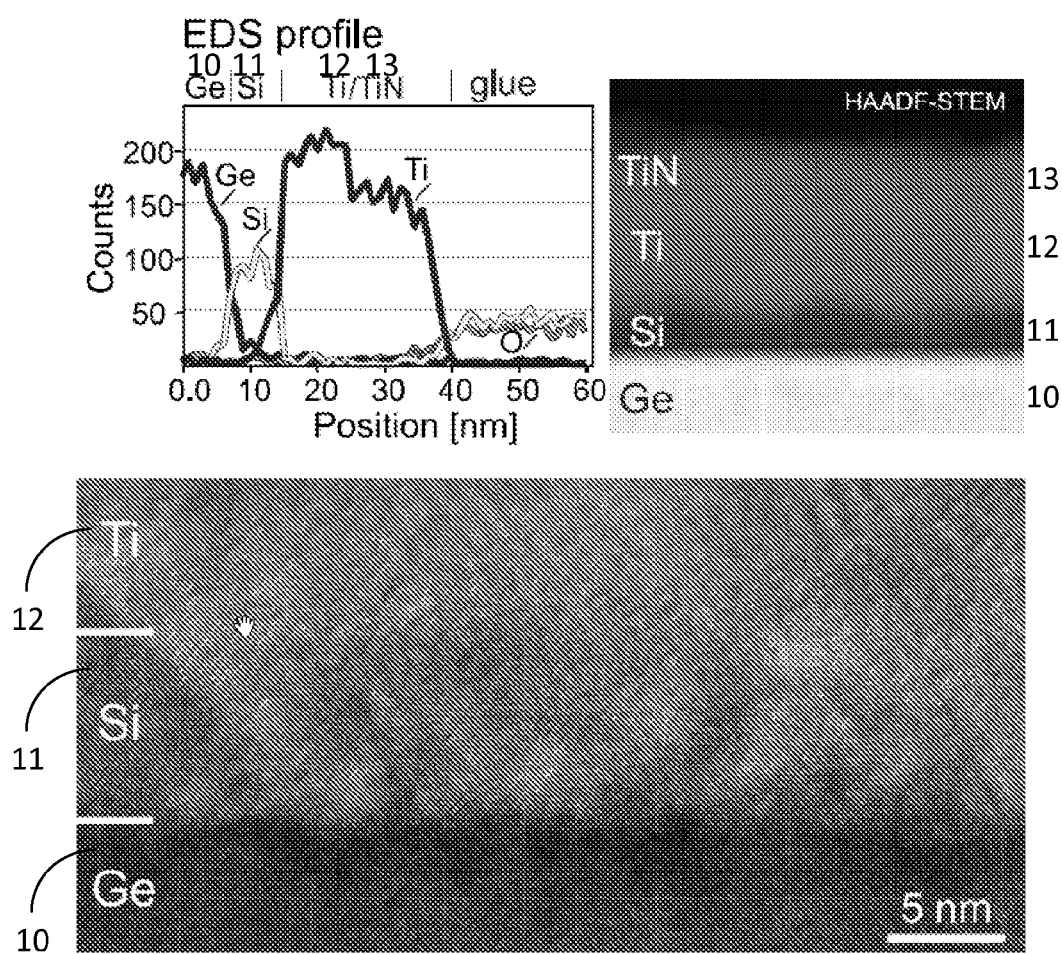
FIG. 1 shows a Transmission Electron Spectroscopy (TEM) picture of a stack comprising a n-type Ge ($1 \times 10^{19}$ cm$^{-3}$) substrate with 10 nm doped Si layer on top and thereupon a Ti/TiN metal stack, in accordance with an example embodiment. A HAADF-STEM (High Angle Annular Dark Field—Scanning Transmission Electron Microscopy) image shows the Ti, Si and Ge layers. An Energy Dispersive Spectrometry (EDS) profile confirms the composition of the layers in the stack.

The drawings are only schematic and are non-limiting. In the drawings, the size of some of the elements or layers may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

In the context of the present invention, contact resistivity refers to the contribution to the total resistance of a material which emanates from contacting two different types of materials, in particular n-type Germanium and a material with electrical resistivity smaller than $1 \times 10^{-2}$ $\Omega$cm, such as e.g. a metal or a metal silicide, as opposed to the intrinsic resistivity which is an inherent property of each of the materials. The contact resistivity is the resistivity at the level of the conductive material-semiconductor interface.

In the context of the present invention, critical thickness of a semiconductor layer is the thickness below which no dislocation occurs if this layer is provided on a lattice-mismatched layer, and above which dislocations do occur. A certain amount of elastic strain can be accommodated by any material without generating dislocations or defects, if its thickness is below the critical thickness. It takes energy to accommodate a layer of lattice-mismatched material. The energy depends on the thickness and the size of the lattice mismatch. It also requires energy to create a dislocation that will relieve the lattice mismatch strain. If the thickness of the semiconductor layer is kept small enough to maintain the elastic strain energy below the energy of dislocation formation (smaller than the critical thickness), a strained-layer structure is formed. If the thickness of the semiconductor layer is larger than the critical thickness, this layer will at least partly relax.

Different embodiments of the present invention describe a method for manufacturing electrical contacts between n-type germanium and a layer of material with electrical resistivity smaller than $1 \times 10^{-2}$ $\Omega$cm, the electrical contacts having a low specific contact resistivity, e.g. a specific contact resistivity below $10^{-4}$ $\Omega$cm$^2$, such as for example below $10^{-5}$ $\Omega$cm$^2$. In some embodiments, the electrical contacts having a low specific contact resistivity are ohmic contacts having a specific contact resistivity $\rho_c$ lower than $2 \times 10^{-6}$ $\Omega$cm$^2$.

In general, an ohmic contact is a region on a semiconductor device that has been prepared so that the current-voltage (I-V) curve of the device is linear and symmetric. If the I-V characteristic is non-linear and asymmetric, the contact is not ohmic, but is a Schottky contact. Low-resistance, stable contacts are critical for the performance and reliability of integrated circuits and their preparation and characterization are major efforts in circuit fabrication.

Electrical contacts between n-type germanium (crystalline or poly-crystalline) and a material with electrical resistivity smaller than $1 \times 10^{-2}$ $\Omega$cm have typically a high contact resistivity (higher than $10^{-4}$ $\Omega$cm$^2$) which is due to Fermi-level pinning and to a low activation of donors in germanium.

A known method to lower the high contact resistivity between n-type germanium and metal is by increasing the activated doping density in germanium by using e.g. laser annealing. The laser annealing typically requires high temperatures (above 700° C.) which are incompatible with low temperature processing of advanced devices.

The present invention describes a method for manufacturing electrical contacts between n-type germanium and a highly conductive material with electrical resistivity smaller than $1 \times 10^{-2}$ $\Omega$cm, the electrical contacts having a specific contact resistivity below $10^{-4}$ $\Omega$cm$^2$, the method comprising:

obtaining a semiconductor substrate having atop a n-type doped germanium region with n-type dopants at a first doping level, forming an interfacial silicon layer overlying the n-type doped germanium region, the interfacial silicon layer, also called silicon passivation layer, being doped with n-type dopants at a second doping level and having a thickness higher than the critical thickness, such that the interfacial layer is at least partially relaxed, and forming a layer with electrical resistivity smaller than $1\times10^{-2}$ Ωcm overlying the interfacial silicon layer.

In particular embodiments the germanium region may be a germanium substrate; in this case "a semiconductor substrate having atop a n-type doped germanium region" may in its entirety be a germanium substrate. Alternatively, the germanium region may be a germanium layer, patterned or unpatterned, provided on top of another suitable substrate, for example a semiconductor substrate, such as for example a silicon or a silicon germanium substrate. The present invention is, however, not limited to these types of substrates, and the substrate can be made of any suitable material or combination of (layers of) material onto which a germanium region can be provided.

In one embodiment of the present invention, a thin in-situ doped epitaxial Si-passivation layer is grown selectively on n-type doped Ge substrate. The dopants of the Si layer are n-type dopants, such as e.g. phosphorus, and, in the embodiment described, are provided at a dopant level of $1\times10^{20}$ cm$^{-3}$. The selective growing of Si on the n-type doped Ge substrate in the example described is followed by a Ti/TiN metal stack deposition. The insertion of the thin Si-passivation layer reduces the pinning and activation limitation, achieving contact resistivity values of about $1\times10^{-6}$ Ωcm$^2$.

Physical modelling of the specific contact resistivities was performed. Without wishing to be bound by theory, it appears that the contact resistivity lowering is due to the good alignment of the Si and Ge conduction bands and the higher doping concentration achieved in Si.

In an example, sample fabrication was started by growing 1 μm of in-situ n-type (P) doped Ge 10 with a doping level of $1\times10^{19}$ cm$^{-3}$ on a $3\times10^{14}$ cm$^{-3}$ p-Si substrate (not illustrated in FIG. 1) at 450° C.

A post epitaxial anneal was performed after n-type Ge growth to reduce defects. Reference samples were prepared according to known methods, e.g. an As implant ($5\times10^{15}$ cm$^2$, 9 keV) followed by a thermal treatment (anneal) at 600° C. for about 5 minutes. This "soak" anneal results in activation levels lower than $1\times10^{19}$ cm$^{-3}$.

A Si interfacial layer 11 was grown selectively only on the n-type doped germanium 10 of the contact areas. Prior to introducing the sample in an epi reactor, a cleaning step, in the example illustrated a HF-based cleaning step, was performed on the Ge substrate. Upon introducing the sample in the epitaxial reactor, a thermal treatment (bake) was performed at 650° C. in the presence of $H_2$. Subsequently, the Si interfacial layer 11 was epitaxially grown at 550° C. for 12 min and, respectively, 15 min using dichlorosilane as precursor. The layer 11 was in-situ doped with $PH_3$ to a doping density of about $1\times10^{20}$ cm$^{-3}$. Resulting thicknesses were about 10 nm and, respectively, 16 nm, as determined by Transmission Electron Microscopy (TEM).

Both the reference samples (without Si layer) and Si-passivated samples received on top a 20 nm Physical Vapor Deposition (PVD) Ti layer 12 followed by a 10 nm PVD TiN 13 or PVD Al. Further, evaporated Al was added on top of the Ti/TiN stacks to make metal sheet resistivity negligible.

FIG. 1 (bottom) represents a cross-section TEM picture and shows the integrity of the sample with a 10 nm doped epitaxial crystalline Si interfacial layer 11. The dark area near the interface between the Si layer 11 and the Ge layer 10, and the uneven contrast in the Si layer 11 are due to strain and defects. The HAADF-STEM (High Angle Annular Dark Field-Scanning Transmission Electron Microscopy) image at the top right of FIG. 1 shows the smoothness of the Si/Ge interface and the rough nature of the Si/Ti interface. No interlayers of an unexpected phase (such as oxides or silicides) are observed with STEM, Energy Dispersive Spectrometry (EDS) and Electron Energy Loss Spectroscopy (EELS, not shown).

Figure 2:
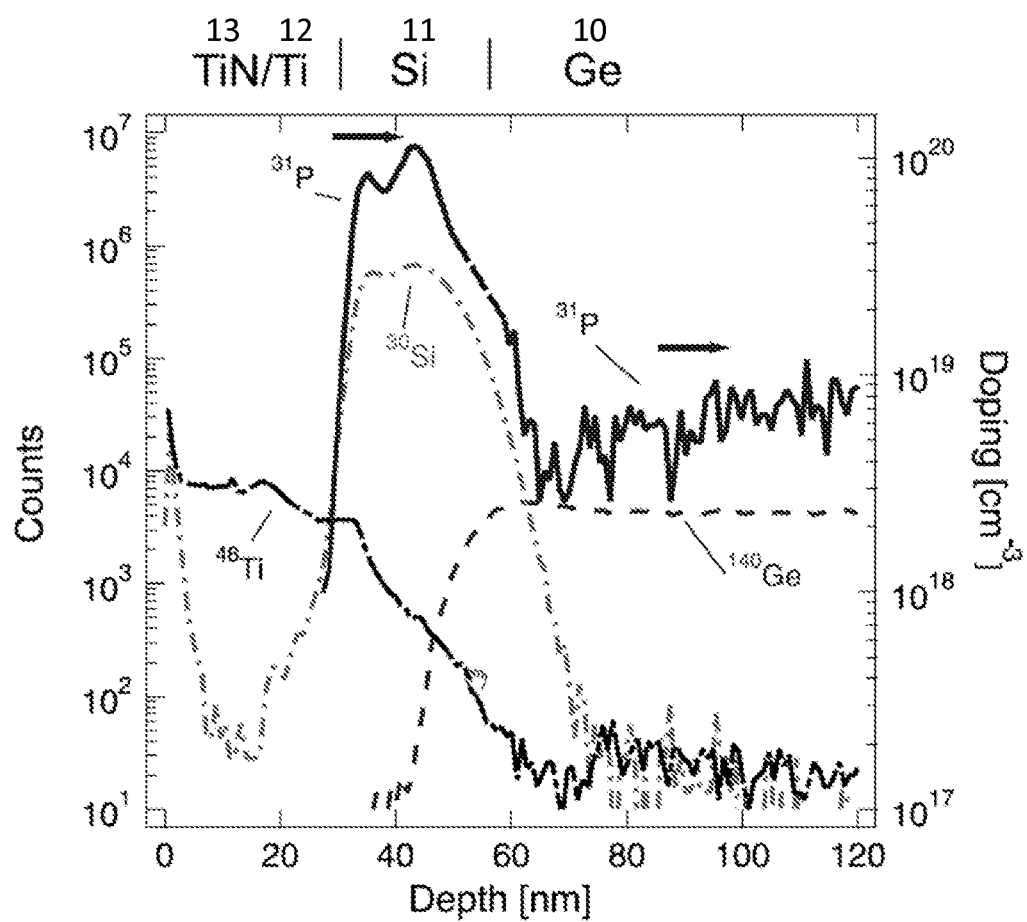
FIG. 2 shows the Secondary Ion Mass Spectroscopy (SIMS) profile of a stack comprising in-situ doped Ge under about 16 nm doped Si, under Ti/TiN metal layers, in accordance with an example embodiment. The Phosphorous-profile (right axis) is quantified with the relevant relative sensitivity factors in the Si and Ge layers and interpolated in between (dashed).

In FIG. 2 a Secondary Ion Mass Spectroscopy (SIMS) depth profile is shown of the n-type doped Ge 10/n-type doped Si 11/Ti 12 sample. Phosphorous (P) concentration is about $1\times10^{20}$ cm$^{-3}$ in the grown Si 11 and about $1\times10^{19}$ cm$^{-3}$ in the bulk Ge 10. Within the uncertainties of quantifying SIMS at interfaces, the results in FIG. 2 shows that P remains confined in the Si-layer 11 and reaches about $3\times10^{18}$ cm$^{-3}$ at the Si/Ge interface with little intermixing into the underlying Ge 10. The decreased concentration of P near the Ge/Si interface is due to outdiffusion during the post-annealing step after Ge-epitaxial growth of the Ge substrate. Physical characterization techniques show the integrity of the contact stack and no unexpected phases.

Figure 3:
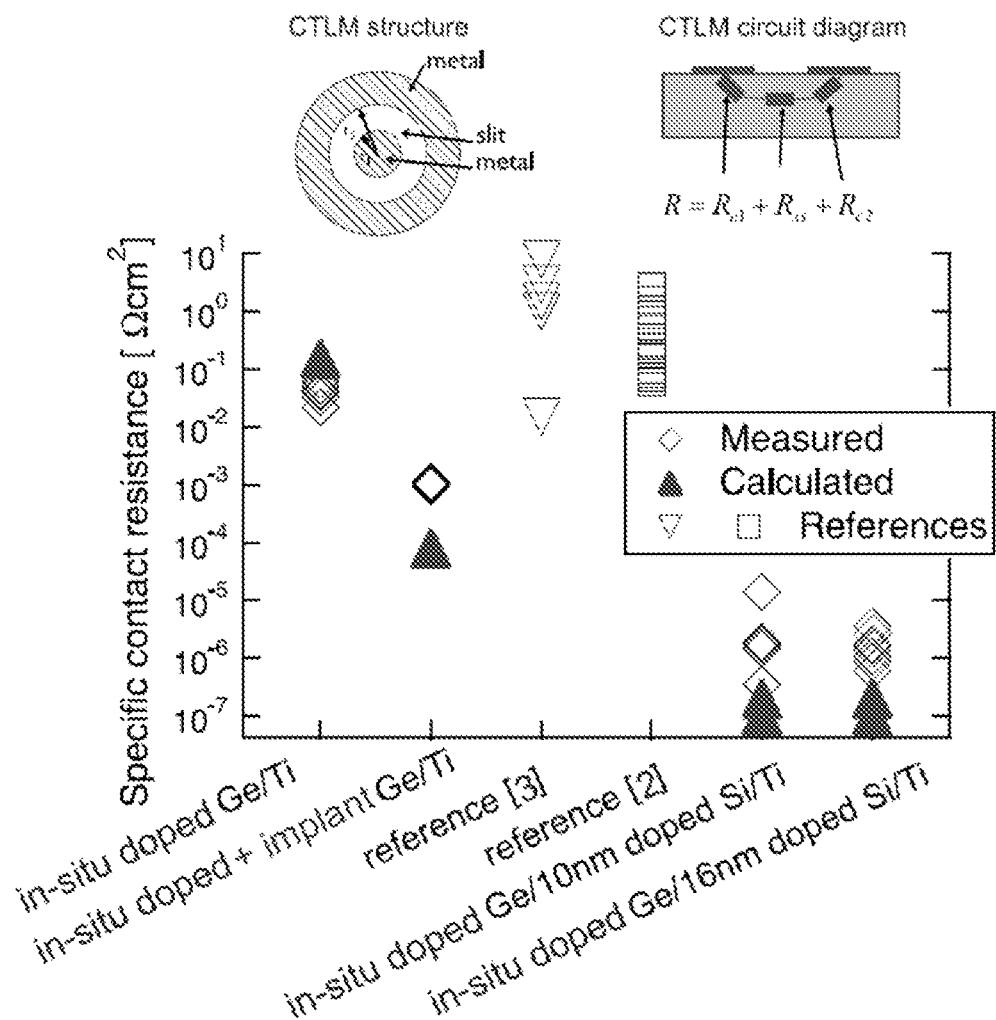
FIG. 3 shows the extracted specific contact resistivities for prior art in-situ doped Ge with Ti/TiN metallization, for prior art in-situ doped Ge followed by As implant and 5 min anneal and Ti/TiN metallization and for prior art in-situ doped Ge/Al, samples from Ref. [3] (Lee et al., Applied Physics Letters 96, 052514 (2010) and Ref. [2] (Kobayashi et al., Proceedings of the Symposium on VLSI Tech. 2008) and for Si-passivated samples according to embodiments of the present invention (10 nm and 16 nm doped Si in between Ge and Ti). Values measured (open diamonds) are in good agreement with values calculated using a physical model of contact resistance $\rho_c$ (full triangles).

To determine the contact resistance circular transmission line method measurements (CTLM) are used (as shown schematically in FIG. 3). The resistance of the structures depends on radius ($r_1$) and slit width ($r_2-r_1$). The CTLM resistance model suitable for a wide range of specific contact resistivities $\rho_c$ consists of the contact resistances $R_{c1}$ (eq. 1) of the inner contact (see circuit schematic in FIG. 3), $R_{c2}$ (eq. 2) of the outer contact, the structure sheet resistance of the Ge ($R_{ss}$) (eq. 3) and a constant parasitic resistance $R_{para}$ due to cabling, probe contacts etc. (not shown in FIG. 3).

$$R_{c1} = \frac{\rho_c}{2\pi r_1 L_T} I_0\left(\frac{r_1}{L_T}\right) / I_1\left(\frac{r_1}{L_T}\right) \quad \text{(eq. 1)}$$

$$R_{c2} = \frac{\rho_c}{2\pi r_2 L_T} K_0\left(\frac{r_2}{L_T}\right) / K_1\left(\frac{r_2}{L_T}\right) \quad \text{(eq. 2)}$$

$$R_{ss} = \frac{R_s}{(2\pi)} \ln\frac{r_2}{r_1} [\Omega] \quad \text{(eq. 3)}$$

$$L_T = \sqrt{\rho_c / R_s} \quad \text{(eq. 4)}$$

LT (eq. 4) is the transfer length and $I_0$, $I_1$, $K_0$, $K_1$ are Bessel functions. This model is fitted to the resistance of measured structures of different geometries to determine the specific contact resistivity $\rho_c$ and the Ge sheet resistivity ($R_s$).

Figure 4:
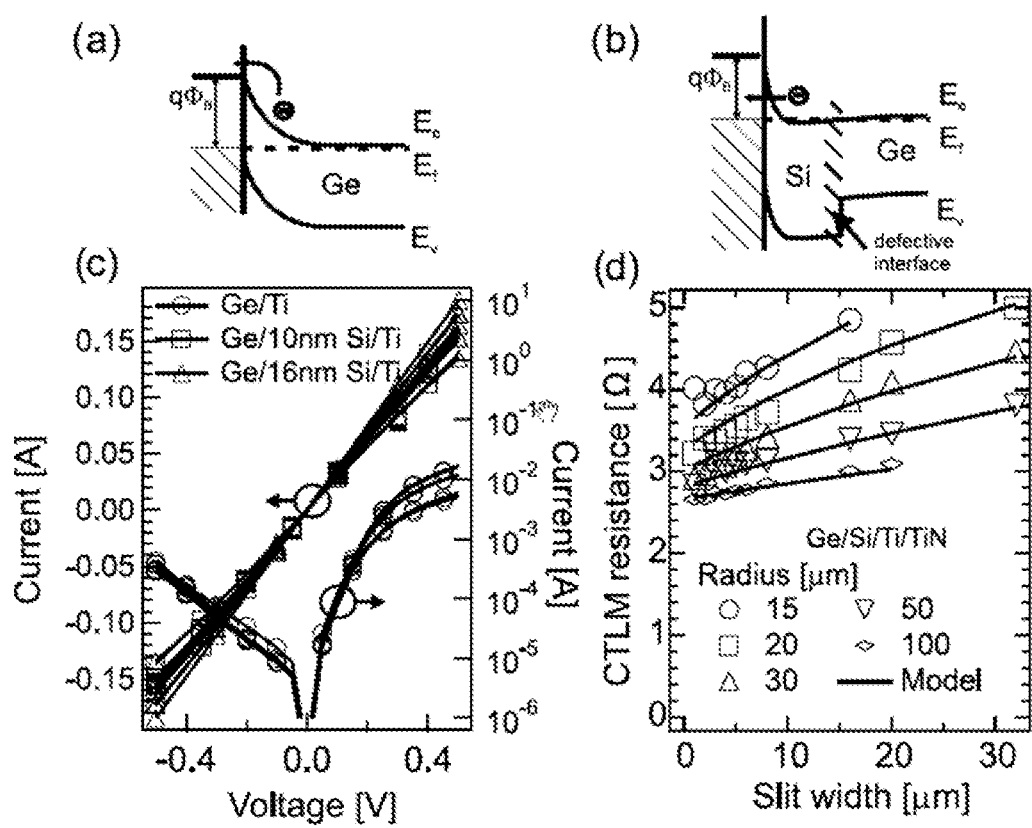
FIG. 4 shows the band diagrams for: (a) prior art n-Ge/Ti contacts, and (b) n-Ge/Ti contacts with insertion of a doped epi-Si layer in between the n-Ge substrate and Ti layer in accordance with embodiments of the present invention.

FIG. 4 shows the band diagrams for: (a) prior art n-type Ge/Ti contacts; and (b) n-type Ge/n-type epi-Si layer/Ti contacts in accordance with embodiments of the present invention. FIG. 4 furthermore shows (c) I-$V_s$ graphs of CTLM structures ($r_1=30$ μm, $r_2-r_1=5$ μm) with reference in-situ doped Ge/Ti stack according to the prior art, and with 10 nm and, respectively, 16 nm in-situ doped silicon layer in accordance with embodiments of the present invention; and (d) Model fit to CTLM resistances at -0.5V of in-situ doped Ge/10 nm doped Si/Ti samples in accordance with embodiments of the present invention of various radius ($r_1$) and slit width ($r_2-r_1$).

Measured CTLM I-$V_s$ graphs are shown in FIG. 4(c). The Schottky diode behaviour of the reference in-situ doped Ge/Ti/TiN is clearly noticed (open circles). Much lower resistance and ohmic behaviour is observed for the in-situ doped Ge/10 nm doped Si/Ti/TiN sample (open squares) and for the in-situ doped Ge/16 nm doped Si/Ti/TiN sample (open triangles), both in accordance with embodiments of the present invention.

The CTLM resistance model fit to the data of the Si passivated sample in accordance with embodiments of the present invention (in-situ doped Ge/10 nm Si/Ti/TiN) is shown in FIG. 4(d).

The specific contact resistivities are shown in FIG. 3. The reference sample n-doped ($1\times10^{19}$ cm$^{-3}$) Ge/Ti yields a poor $\rho_c=4.4\times10^{-2}$ Ωcm$^2$. Adding an As-implant and 5 min anneal yields $\rho_c=1.0\times10^{-3}$ Ωcm$^2$, which is an improvement as expected from an active dopant concentration increase.

Without wishing to be bound by theory, a physical model of the contact resistivity $\rho_c$ was developed. The physical model for n-type Ge contact resistivity $\rho_c$ takes into account field emission and thermionic field emission including the effect of image-force barrier lowering. Calculated values for the Ge/Ti contact resistivity $\rho_c$ using a barrier height of 0.57 eV yields a $\rho_c=1.5\times10^{-1}$ Ωcm$^2$ for $3\times10^{18}$ cm$^{-3}$, $\rho_c=8\times10^{-5}$ Ωcm$^2$ for $1\times10^{19}$ cm$^{-3}$ doping density.

These results approximate the measured values taking into account that the Ge doping at the surface is about $3\times10^{18}$ cm$^{-3}$ and maximum active concentration for As-implants with regular anneal is about $1\times10^{19}$ cm$^{-3}$ (as shown in FIG. 3).

Also some reference values from literature have been added to FIG. 3. In the referred work (see below) an insulator inserted between the doped germanium and the electrode material with electrical resistivity smaller than $1\times10^{-2}$ Ωcm was used. The doping density ($1\times10^{19}$ cm$^{-3}$) is of a similar order as the Ge doping density of embodiments of the present invention.

FIG. 3 shows the extracted specific contact resistivities for in-situ doped Ge/Ti/TiN, in-situ doped Ge followed by As implant and 5 min anneal/Ti/TiN and in-situ doped Ge/Al, samples from Ref. [3] (Lee et al., Applied Physics Letters 96, 052514 (2010)) and Ref. [2] (Kobayashi et al., Proceedings of the Symposium on VLSI Tech (2008)) and Si-passivated samples according to embodiments of the present invention. Values measured (open diamonds) are in good agreement with values calculated using a physical model of $\rho_c$ (full triangles).

Further, in FIG. 3 the extracted specific contact resistivities are shown for the samples with doped Si passivation layer in accordance with embodiments of the present invention. A remarkable improvement is observed to $\rho_c=1.4\times10^{-6}$ Ωcm$^2$ for the 10 nm Si sample and $1.7\times10^{-6}$ Ωcm$^2$ for the 16 nm sample.

It can be seen from FIG. 3 that the specific contact resistivities of contacts between n-Ge and material with electrical resistivity smaller than $1\times10^{-2}$ Ωcm in accordance with embodiments of the present invention are lower than prior art specific contact resistivities. This demonstrates that inserting a doped silicon layer 11 between the n-Ge layer 10 and the layer with electrical resistivity smaller than $1\times10^{-2}$ Ωcm, e.g. metal layer 12, lowers $\rho_c$ on n-Ge to a value below $1\times10^{-4}$ Ωcm$^2$, e.g. in the order of $1\times10^{-6}$ Ωcm$^2$ showing that with the method of embodiments of the present invention dopant activation limitations and Fermi-level pinning can be overcome in n-type doped Ge.

For bulk n-Si doped to $1\times10^{20}$ cm$^{-3}$ and for Ti with barrier height of 0.5-0.6 eV in a Si/Ti stack, the specific contact resistivity $\rho_c$ is 1 to $2\times10^{-7}$ Ωcm$^2$ which is comparable but still somewhat lower than the observed value for Si-passivated germanium in accordance with embodiments of the present invention.

The nature of the contact resistivity $\rho_c$ may be explained by the band diagrams in FIG. 4(a) and FIG. 4(b). In n-Ge contacts thermionic emission dominates conduction due to the high Schottky barrier height and limited activated doping level (FIG. 4(a)). n-Ge contacts without the interfacial Si layer typically show Schottky diode I-V characteristics.

The expected nature of an n-Ge contact with an inserted interfacial Si layer in accordance with embodiments of the present invention is illustrated in FIG. 4(b). The barrier height for bulk Si/Ti is 0.5 eV-0.6 eV, which is lower than or similar compared to 0.57 eV for Ge/Ti. The difference is not large even though Si shows a depinning factor of about 0.27. In the epitaxial Si the activated doping is higher compared to any of the n-Ge samples, causing tunneling to dominate and 'material-with-electrical-resistivity-smaller-than-$1\times10^{-2}$-Ωcm'-to-Si contacts to be ohmic and low resistive.

In case of fully strained Si-passivation layers the electron barrier at the Si—Ge interface is about 0.55 eV. In case of a Si thickness above the critical thickness, the Si is expected to be (partially) relaxed. Relaxed Si on Ge shows a small difference (50 meV) in electron affinity and hence a small electron barrier.

The low values of the specific contact resistivity $\rho_c$ obtained with the method of embodiments of the present invention correlate with the fact that the interface corresponds to the (partially) relaxed case. The modelling shows that given a Ge doping level of $3\times10^{18}$ cm$^{-3}$ the Si—Ge barrier has to be lower than 0.23 eV to obtain $\rho_c$ lower than $1\times10^{-6}$ Ωcm$^2$. The slightly higher specific contact resistivity $\rho_c$ obtained with the method of embodiments of the present invention when compared to calculated values for Ti/bulk Si contacts shown in FIG. 3, might be due to defects and/or slight band misalignments due to strain built up by lattice mismatch at or near the Ge/Si interface.

The low specific contact resistivity $\rho_c$ to n-doped Ge ($\rho_c<2\times10^{-6}$ Ωcm$^2$) obtained with the method of embodiments of the present invention demonstrates the possibility of eliminating Fermi level pinning and dopant activation limits in n-Ge contacts. This is an improvement compared to typical best values of about $10^{-4}$ Ωcm$^2$ achieved by previously reported techniques, opening the opportunity to implement Ge in advanced CMOS and memory applications.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

What is claimed is:

1. A method comprising:
    obtaining a semiconductor substrate comprising a germanium region consisting of germanium doped with n-type dopants at a first doping level;
    forming an epitaxially grown interfacial silicon layer overlying the germanium region, wherein the epitaxially grown interfacial silicon layer is doped with n-type dopants at a second doping level that is at least $1\times10^{19}$ cm$^{-3}$, thereby overcoming Fermi-level pinning and dopant activation limitation in the germanium region, and wherein the epitaxially grown interfacial silicon layer has a thickness between five monolayers and 50 nm and is at least partially relaxed; and
    forming over the epitaxially grown interfacial silicon layer a layer of material having an electrical resistivity smaller than $1\times10^{-2}$ Ωcm, thereby forming an electrical contact between the germanium region and the layer of material, wherein the electrical contact has a specific contact resistivity below $10^{-4}$ $\Omega cm^2$.

2. The method of claim 1, wherein the second doping level is higher than the first doping level.

3. The method of claim 1, wherein forming the epitaxially grown interfacial silicon layer doped with n-type dopants at the second doping level comprises introducing n-type dopants into the epitaxially grown interfacial silicon layer during formation thereof.

4. The method of claim 1, wherein the epitaxially grown interfacial silicon layer comprises a monocrystalline silicon layer.

5. The method of claim 1, wherein the epitaxially grown interfacial silicon layer comprises a polycrystalline silicon layer.

6. The method of claim 1, wherein forming a layer of material comprises the epitaxially grown interfacial silicon layer being at least partially consumed to form a silicide.

7. The method of claim 1, further comprising forming the epitaxially grown interfacial silicon layer overlying the germanium region using dichlorosilane as a precursor.

8. The method of claim 1, wherein the epitaxially grown interfacial silicon layer is doped with $PH_3$.

9. An electrical contact comprising:
a germanium region consisting of germanium doped with n-type dopants at a first doping level;
an epitaxially grown interfacial silicon layer on the germanium region, wherein the epitaxially grown interfacial silicon layer is doped with n-type dopants at a second doping level that remain confined within the epitaxially grown interfacial silicon layer, wherein the second doping level is at least $1 \times 10^{19}$ $cm^{-3}$, thereby overcoming Fermi-level pinning and dopant activation limitation in the germanium region, and wherein the epitaxially grown interfacial silicon layer has a thickness between five monolayers and 50 nm and is at least partially relaxed; and
a layer of material overlying the epitaxially grown interfacial silicon layer and having an electrical resistivity smaller than $1 \times 10^{-2}$ $\Omega cm$,
wherein the electrical contact is formed between the germanium region and the layer of material, and wherein the electrical contact has a specific contact resistivity below $10^{-4}$ $\Omega cm^2$.

10. The electrical contact of claim 9, wherein the second doping level is higher than the first doping level.

11. The electrical contact of claim 9, wherein the epitaxially grown interfacial silicon layer is a monocrystalline layer.

12. The electrical contact of claim 9, wherein the epitaxially grown interfacial silicon layer is a polycrystalline layer.

13. The electrical contact of claim 9, wherein the electrical contact is a component of a semiconductor device.

14. An electrical contact comprising:
a germanium region consisting of germanium doped with n-type dopants at a first doping level;
an epitaxially grown interfacial silicon layer on the germanium region, wherein the epitaxially grown interfacial silicon layer is doped with n-type dopants at a second doping level that is at least $1 \times 10^{19}$ $cm^{-3}$, thereby overcoming Fermi-level pinning and dopant activation limitation in the germanium region, and wherein the epitaxially grown interfacial silicon layer has a thickness between five monolayers and 50 nm and is at least partially relaxed; and
a layer of material overlying the epitaxially grown interfacial silicon layer and having an electrical resistivity smaller than $1 \times 10^{-2}$ $\Omega cm$,
wherein the electrical contact is formed between the germanium region and the layer of material, and wherein the electrical contact has a specific contact resistivity below $10^{-4}$ $\Omega cm^2$.

15. The electrical contact of claim 14, wherein the epitaxially grown interfacial silicon layer has a thickness lower than 20 nm.

* * * * *